(12) United States Patent
Condie et al.

(10) Patent No.: US 7,332,414 B2
(45) Date of Patent: Feb. 19, 2008

(54) CHEMICAL DIE SINGULATION TECHNIQUE

(75) Inventors: Brian W. Condie, Mesa, AZ (US); David J. Dougherty, Tempe, AZ (US); Mahesh K. Shah, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 350 days.

(21) Appl. No.: 11/159,553

(22) Filed: Jun. 22, 2005

(65) Prior Publication Data
US 2006/0292827 A1    Dec. 28, 2006

(51) Int. Cl.
*H01L 21/00* (2006.01)
(52) U.S. Cl. ............... 438/460; 438/462; 438/464; 257/E21.001
(58) Field of Classification Search ......... 438/460–465
See application file for complete search history.

(56) References Cited

U.S. PATENT DOCUMENTS

| | | | |
|---|---|---|---|
| 5,888,882 A * | 3/1999 | Igel et al. ............ | 438/460 |
| 5,904,546 A | 5/1999 | Wood et al. | |
| 5,919,713 A * | 7/1999 | Ishii et al. ........... | 438/464 |
| 6,048,777 A | 4/2000 | Choudhury et al. | |
| 6,492,195 B2 * | 12/2002 | Nakanishi et al. ...... | 438/106 |
| 6,573,156 B1 | 6/2003 | Wang et al. | |
| 2004/0124543 A1 | 7/2004 | Condie et al. | |

FOREIGN PATENT DOCUMENTS

EP        1026725        8/2000

* cited by examiner

*Primary Examiner*—Michael Lebentritt
*Assistant Examiner*—Angel Roman
(74) *Attorney, Agent, or Firm*—Ingrassia, Fisher & Lorenz, P.C.

(57) ABSTRACT

A method is provided for manufacturing a semiconductor device from a substrate (200) having an active surface (204) and a non-active surface (206). The method comprises depositing a backing material (104) onto the non-active surface of the substrate (206) in a pattern (500), the pattern (500) having at least a first die section (210), a second die section (212) adjacent the first die section (210), and a strip (216) connecting the first die section (210) and the second die section (212), removing material from portions of the non-active surface of the substrate (206) on which the backing material (104) is not deposited to thereby partially separate the substrate (200) into a first die (236) and a second die (238) connected to one another by the strip (254) of the deposited backing material, and breaking the strip connector (254) to separate the first die (236) from the second die (238).

19 Claims, 2 Drawing Sheets

CHEMICAL DIE SINGULATION TECHNIQUE

FIELD OF THE INVENTION

The present invention generally relates to semiconductor dice, and, more particularly, to a method for singulating die.

BACKGROUND OF THE INVENTION

Dice are becoming increasingly more complex and may include a number of thin layers of insulating and conducting materials that are used to construct integrated circuitry thereon. Additionally, to increase operating speeds and reduce power, low dielectric constant materials are used. In some cases, materials other than silicon, e.g., gallium arsenide and gallium nitride, are used to produce the semiconductor wafers from which dice are made. These newer materials are more fragile than conventionally used materials.

To make efficient use of the above-mentioned materials, thousands of die are typically produced from a single wafer. The wafer is then separated into individual dice by means of one of a variety of known singulation or dicing processes. In one example, a dicing process uses a rotating saw that mechanically grinds a non-active area of the semiconductor wafer until adjoining dice are detached from one another. Typically, the saw movement follows a substantially straight line path, and consequently, the dice are generally rectangular or square in shape. Each die in a wafer is typically the same size or of an integer multiple that accommodates the wafer sawing process.

Although saw dicing has been effectively used for singulating dice in the past, it has not been adequate for singulating newer and thinner dice and for wafer material that are more fragile. For example, the rotating saw may inadvertently damage the die edges. Specifically, the saw may cause edge defects on outer peripheral edges or corners of the dice, such as micro-cracks. These defects may form crack propagation sites. Additionally, the presence of edge defects and cracks makes the die especially prone to cracking or chipping at places along its perimeter where it is sawn from the wafer when used later in semiconductor assembly processing or in an end-use application. The aforementioned issues may result in yield loss and may compromise the operability of the resultant device.

Accordingly, it would be desirable to provide a method for manufacturing a semiconductor device that minimizes losses that result from cracking and chipping of the die during assembly. Additionally, it would be desirable to provide a method for making a semiconductor device that permits the manufacture of die of various sizes and shapes within a single wafer from various substrate materials, such as silicon, gallium arsenide, gallium nitride, or the like, without increased incidence of cracking or chipping of the die. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
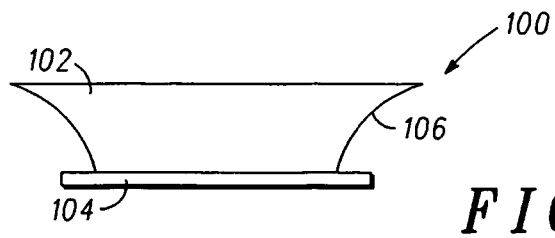
FIG. 1 is a cross-sectional view of an exemplary die.

FIG. 1 shows an exemplary singulated die 100 that includes a substrate layer 102 and a backing material 104 deposited thereon. Substrate layer 102 may be made of any one of numerous substrate materials conventionally used to construct a die, such as, for example, silicon, gallium arsenide, and gallium nitride. Substrate layer 102 may also include conductive or insulative materials within which non-illustrated device components, such as transistors, interconnects, or other conventional circuit components, are formed. Substrate layer 102 preferably includes a smooth edge sidewall 106 which has reduced edge defects. Although FIG. 1 shows sidewall 106 as curved, other configurations may suitably be employed. Backing material 104 protects wafer 102 during etching processes employed in the manufacture of die 100, and is preferably a material that may be compatible for later packaging assembly. Backing material 104 may be metal or non-metal. Suitable metals include, but are not limited to gold, vanadium, titanium, Ti/NiV/Au, Cr/Ag, Ti/Au, and suitable non-metals include, but are not limited to passivation silicon oxide, glass, nitride, ceramics, or organics.

Figure 2:
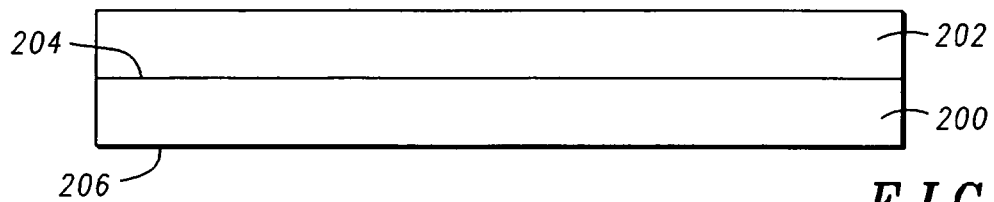
FIGS. 2-4 are simplified cross-sectional views of an exemplary substrate that may be used during various steps of an exemplary method for manufacturing the exemplary die depicted in FIG. 1.
Figure 3:
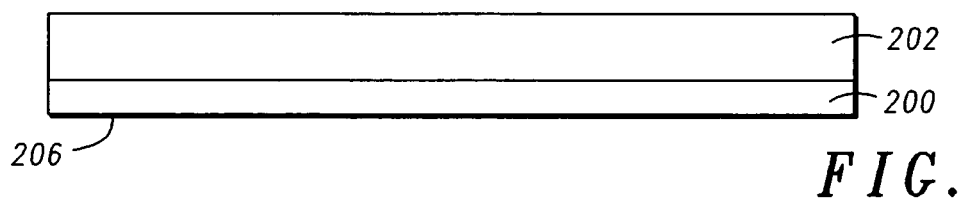

Referring to FIG. 2, substrate 200, preferably made of one of the materials mentioned above in connection with substrate layer 102, is bonded to a handle wafer 202. In this regard, substrate 200 has an active surface 204 bonded to handle wafer 202 and a non-active surface 206 that remains exposed. Substrate 200 may be bonded to handle wafer 202 using conventional techniques, such as, for example, those employing thermoset epoxy, thermoplastic or organic adhesive, or wax. Handle wafer 202 may be made of any suitable material, e.g., sapphire, garnet, alumina, ceramic, glass, quartz, or ferrite. If desired, material from non-active surface 206 of substrate 200 may be removed to reduce the thickness of substrate 200, as shown in FIG. 3. In another exemplary embodiment, handle wafer 202 is not bonded to substrate 200 and both active surface 204 and non-active surface 206 remain exposed.

Next, backing material 104 is deposited onto substrate 200 (FIG. 4) in a pattern. In an embodiment in which substrate 200 is not bonded to handle wafer 202, backing material 104 may be deposited onto active surface 204. If handle wafer 202 is bonded to substrate 200, backing material 104 is preferably deposited onto non-active surface 206. Any well-known deposition process may be employed. For example, sputtering may be used to deposit backing material 104 onto non-active surface 206. In addition, a photoetching process may be performed to pattern backing material 104 onto substrate 200. In such a process, backing material 104 is deposited to cover non-active surface 206 of substrate 200. A photoresist material is deposited over backing material 104 in the desired pattern, and portions of backing material 104 not protected by the photoresist material are etched away. In another example, a shadowmask process may be performed on substrate 200. In this case, a mask outlining the desired pattern is placed over non-active surface of substrate 200, and backing material 104 is deposited over substrate 200 and the mask. Then, the mask is removed from substrate 200, and the backing material 104 remaining on substrate 200 forms the desired pattern.

Figure 5:
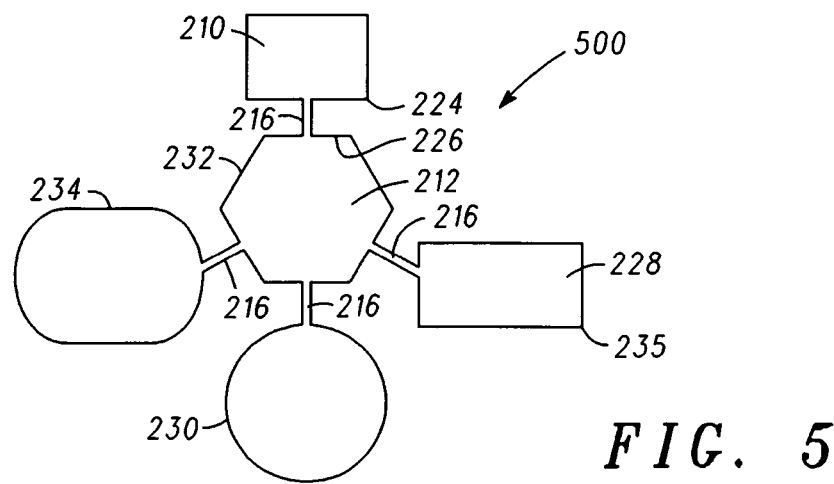
FIG. 5 is a top view of the substrate depicted in FIG. 4.

The desired pattern may have a variety of configurations. An exemplary pattern 500 is shown in FIG. 5. In this embodiment, pattern 500 comprises at least a first die section 210, and a second die section 212 connected to first die section 210 by a strip 216. First die section 210 and second die section 212 are adjacent one another and each has an edge 224 and 226, respectively. First and second die sections 210 and 212 have shapes that correspond to a desired shape of die 100. In this regard, first and second die sections 210 and 212 may be, for example, polygonal (e.g. rectangle 228), non-rectangular (e.g. circular 230), and have any desired number of sides (e.g., pentagonal, hexagonal 232, septagonal, etc.). If desired, the die shapes may be provided with rounded corners 234 or sharp corners 235. Although only two die sections 210 and 212 are discussed herein, it will be appreciated that more than two die shapes may be included in the pattern, such as depicted in FIG. 5.

Strips 216 are provided to connect the edges (e.g. 224 and 226) of adjacent die sections (e.g. 210 and 212) together. To this end, strips 216 are relatively narrow. It will be appreciated that the number of strips must be sufficient so as to result in a structure capable of holding the resulting first and second dice together during later process steps.

Figure 4:
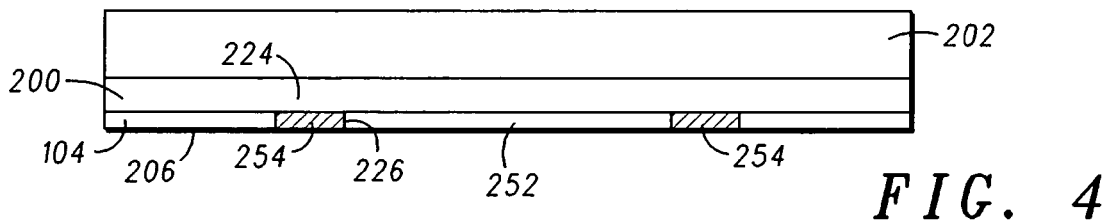

In one exemplary embodiment, backing material 104 is deposited onto substrate 200 to form pattern 500. With reference to FIGS. 4 and 5, a first die shape section 250 having the same shape as first die section 210, a second die shape section 252 having the same shape as second die section 212, and a strip 254 shaped similarly to strip 216 are formed in backing material 104. Strip 254 connects first die section 250 to second die section 252.

Figure 6:
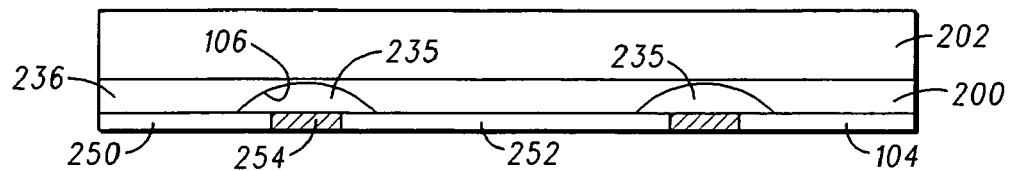
FIGS. 6-9 are simplified cross-sectional views of an exemplary substrate that may be used during various steps of an exemplary method for manufacturing the exemplary die depicted in FIG. 1.

Next, those portions of substrate 200 not protected by backing material 104 are removed forming wall 106 and partially separating substrate 200 into at least a first die 236 and a second die 238, as illustrated in FIG. 6. This step may be performed, for example, by chemical etching; e.g. an isotropic dry or wet etch or an anisotropic etch process may be used. Preferably, a chemical etching process is employed that laterally etches a portion 235 of substrate 200. In any case, first and second dice 236 and 238 remain attached to one another at least by strip 254.

Figure 7:
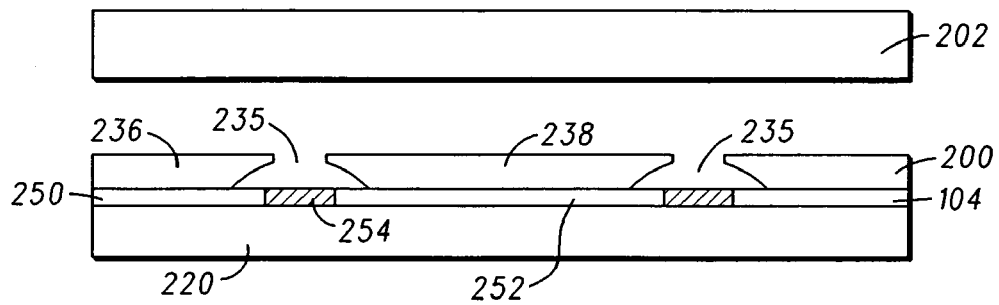

Then, handle wafer 202 is separated from substrate 200 by any conventional means; e.g. by heating or by exposure to a suitable chemical, such as acetone. During this step, first and second dice 236 and 238 still remain attached to one another by strip 254. Then, an adhesive tape 220 may be coupled to backing material 104, as illustrated in FIG. 7. It will be appreciated that any type of adhesive tape conventionally used in semiconductor processing may be used.

Figure 8:
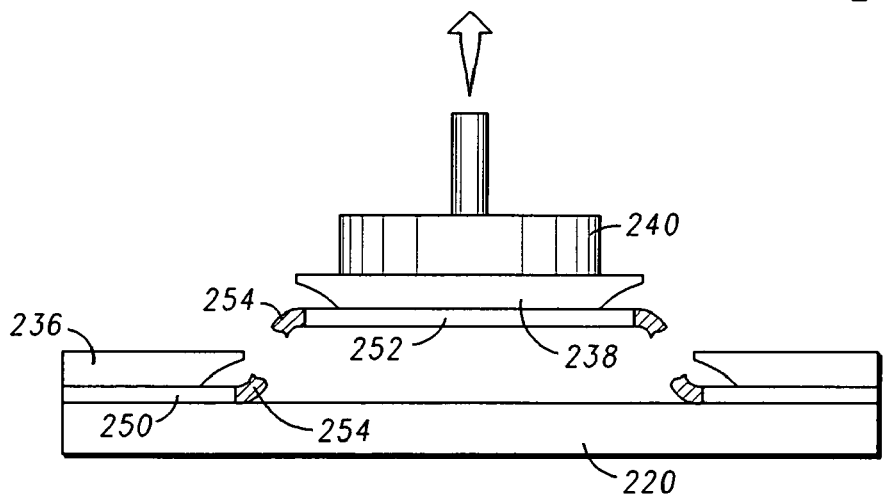
Figure 9:
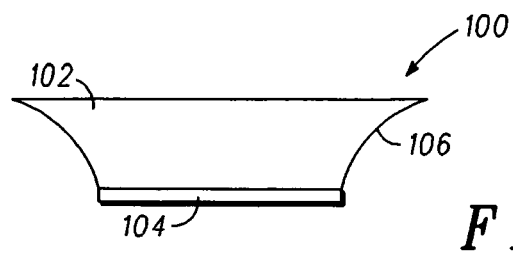

Next, strip 254 is broken to thereby separate first and second dice 236 and 238, as illustrated in FIG. 8. For example, strip 254 may be sawed using a saw capable of breaking strip connectors. If desired, first and second die sections 236 and 238 are thermally separated using a laser or a high pressure water stream may be directed at strips 254. Alternatively, first and second die sections 236 and 238 may be separated using a conventional removal tool 240 that lifts second die second 212, or any other die section, from tape 220, as shown in FIG. 8. For example, first or second die sections 236 and 238 may be picked and placed using a collet pick or any other suitable equipment. In another exemplary embodiment, strips 254 may be removed, as shown in FIG. 9.

Once separated, the semiconductor die may be further processed for end-use applications. For example, backing material 104 may be used for solder die attach or epoxy die attach processes.

Methods have now been provided for manufacturing a semiconductor device from a substrate having an active surface and a non-active surface. In one exemplary embodiment, the method includes the steps of depositing a backing material onto the non-active surface of the substrate in a pattern, the pattern having at least a first die section, a second die section adjacent the first die section, and a strip connecting the first die section and the second die section, removing material from portions of the non-active surface of the substrate on which the backing material is not deposited to thereby partially separate the substrate into a first die and a second die connected to one another by the strip of the deposited backing material, and breaking the strip connector to separate the first die from the second die.

In another exemplary embodiment, the step of depositing may include the steps of placing a shadow mask having an outline of the pattern formed therein over the non-active surface of the substrate, and depositing the backing material over the shadow mask and the non-active surface of the substrate to thereby form the pattern on the substrate. Alternatively, the step of depositing may comprise depositing a metal. Alternatively, the step of depositing may comprise depositing a non-metal. In another exemplary embodiment, the step of depositing may comprise depositing the backing material over the non-active surface of the substrate, depositing photoresist in the pattern over the deposited backing material, wherein at least a portion of the deposited backing material is exposed, and etching the exposed backing material.

In another embodiment, the first die section is circular. In another exemplary embodiment, the first die section is polygonal having rounded or sharp corners. In still another embodiment, the method further comprises bonding a handle wafer to the active surface of the substrate. Alternatively, the method may include reducing a thickness of the substrate, after the step of bonding the active surface of the substrate to a handle wafer. In another exemplary embodiment, the method includes removing the substrate from the handle wafer, and coupling the substrate to adhesive tape, after the step of removing. Alternatively, the method includes coupling the substrate to adhesive tape, after the step of removing material from portions of the non-active surface of the substrate on which the backing material is not deposited.

In one exemplary embodiment, the step of removing material from portions of the non-active surface of the substrate on which the backing material is not deposited comprises etching the substrate. In another exemplary embodiment, the step of etching the substrate comprises isotropically dry etching the substrate. In still another exemplary embodiment, the step of etching the substrate comprises isotropically wet etching the substrate. Alternatively, the step of breaking the strip connector comprises sawing the strip connector.

In another exemplary method, the method comprises bonding a handle wafer to an active surface of the substrate, reducing a thickness of a non-active surface of the substrate, depositing a backing material in a pattern onto the non-active surface of the substrate, the pattern having at least a first die section, a second die section adjacent the first die section, and a strip connecting the first die section to the second die section, chemically removing a portion of the non-active surface of the substrate on which backing material is not deposited to partially separate the substrate into a first die and a second die connected to one another by the strip of the deposited backing material, removing the handle wafer from the substrate, coupling the deposited backing material to adhesive tape, and breaking the strip to detach the first die from the second die. In one embodiment of the method, the step of chemically removing includes the step of etching the exposed portion of the substrate. In another embodiment, the first die section is circular. In still another embodiment, the first die section is polygonal having rounded or sharp corners.

In still yet another exemplary embodiment, a method is provided for manufacturing a die from a substrate that includes the steps of depositing a backing layer in a pattern on an active surface of the substrate, the pattern having at least a first die section, a second die section adjacent the first die section, and a strip connecting the first die section to the second die section, etching a portion of the active surface of the substrate on which backing layer is not deposited to thereby partially separate the substrate into a first die and the second die while maintaining the first die and the second die connected to one another by the strip, and breaking the strip to detach the first die from the second die.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for manufacturing a semiconductor device from a substrate having an active surface and a non-active surface, the method comprising:
    depositing a backing material onto the non-active surface of the substrate in a pattern, the pattern having at least a first die section, a second die section adjacent the first die section, and a strip connecting the first die section and the second die section;
    removing material from portions of the non-active surface of the substrate on which the backing material is not deposited to thereby partially separate the substrate into a first die and a second die connected to one another by the strip of the deposited backing material; and
    breaking the strip connector to separate the first die from the second die.

2. The method of claim 1, wherein the step of depositing comprises:
    placing a shadow mask having an outline of the pattern formed therein over the non-active surface of the substrate; and
    depositing the backing material over the shadow mask and the non-active surface of the substrate to thereby form the pattern on the substrate.

3. The method of claim 1, wherein the step of depositing comprises depositing a metal.

4. The method of claim 1, wherein the step of depositing comprises depositing a non-metal.

5. The method of claim 1, wherein the step of depositing comprises:
    depositing the backing material over the non-active surface of the substrate;
    depositing photoresist in the pattern over the deposited backing material, wherein at least a portion of the deposited backing material is exposed; and etching the exposed backing material.

6. The method of claim 1, wherein the first die section is circular.

7. The method of claim 1, wherein the first die section is polygonal having corners that are rounded or sharp.

8. The method of claim 1, further comprising: bonding a handle wafer to the active surface of the substrate.

9. The method of claim 8, further comprising: reducing a thickness of the substrate, after the step of bonding the active surface of the substrate to a handle wafer.

10. The method of claim 9, further comprising:
    removing the substrate from the handle wafer; and
    coupling the substrate to adhesive tape after the step of removing.

11. The method of claim 1, further comprising:
    coupling the substrate to adhesive tape, after the step of removing material from portions of the non-active surface of the substrate on which the backing material is not deposited.

12. The method of claim 1, wherein the step of removing material from portions of the non-active surface of the substrate on which the backing material is not deposited comprises etching the substrate.

13. The method of claim 12, wherein the step of etching the substrate comprises using a dry etching process on the substrate.

14. The method of claim 12, wherein the step of etching the substrate comprises using a wet etching process on the substrate.

15. The method of claim 1, wherein the step of breaking the strip connector comprises sawing the strip connector.

16. A method for manufacturing a die from a substrate, the method comprising:
    bonding a handle wafer to an active surface of the substrate;
    reducing a thickness of a non-active surface of the substrate;
    depositing a backing material in a pattern onto the non-active surface of the substrate, the pattern having at least a first die section, a second die section adjacent the first die section, and a strip connecting the first die section to the second die section;
    chemically removing a portion of the non-active surface of the substrate on which backing material is not deposited to partially separate the substrate into a first die and a second die connected to one another by the strip of the deposited backing material;
    removing the handle wafer from the substrate;
    coupling the deposited backing material to adhesive tape; and
    breaking the strip to detach the first die from the second die.

17. The method of claim 16, wherein the step of chemically removing includes the step of etching the exposed portion of the substrate.

18. The method of claim 16, wherein the first die section is circular.

19. The method of claim 16, wherein the first die section is polygonal having corners that are rounded or sharp.

* * * * *